(12) United States Patent
Riebel

(10) Patent No.: US 8,154,869 B2
(45) Date of Patent: Apr. 10, 2012

(54) METHOD AND DEVICE FOR COOLING HEAT-GENERATING COMPUTER COMPONENTS

(75) Inventor: Michael Riebel, Kissing (DE)

(73) Assignee: Fujitsu Technology Solutions Intellectual Property GmbH (DE)

( * ) Notice: Subject to any disclaimer, the term of this patent is extended or adjusted under 35 U.S.C. 154(b) by 209 days.

(21) Appl. No.: 12/628,403

(22) Filed: Dec. 1, 2009

(65) Prior Publication Data

US 2010/0142142 A1 Jun. 10, 2010

(30) Foreign Application Priority Data

Dec. 5, 2008 (DE) .................. 10 2008 060 777

(51) Int. Cl.
*H05K 7/20* (2006.01)
*F28F 7/00* (2006.01)

(52) U.S. Cl. ....... 361/694; 165/80.2; 165/185; 361/695; 361/703

(58) Field of Classification Search .................. None
See application file for complete search history.

(56) References Cited

U.S. PATENT DOCUMENTS

| | | | | |
|---|---|---|---|---|
| 4,103,737 A | * | 8/1978 | Perkins ................... | 165/109.1 |
| 5,285,347 A | * | 2/1994 | Fox et al. .................. | 361/699 |
| 6,888,725 B2 | * | 5/2005 | Kubo et al. .................. | 361/719 |
| 2005/0041391 A1 | * | 2/2005 | Wrycraft et al. ............ | 361/695 |
| 2007/0115632 A1 | * | 5/2007 | Chen et al. ................ | 361/695 |
| 2007/0165380 A1 | * | 7/2007 | Lai et al. ..................... | 361/697 |
| 2007/0235168 A1 | * | 10/2007 | Chen et al. ................ | 165/124 |
| 2008/0041562 A1 | * | 2/2008 | Bhatia ........................ | 165/80.3 |

FOREIGN PATENT DOCUMENTS

| | | |
|---|---|---|
| DE | 202 21 237 U1 | 8/2005 |
| JP | 61-12246 | 1/1986 |
| JP | 1-215098 A | 8/1989 |
| JP | 5-36846 | 5/1993 |
| JP | 2000-91776 | 3/2000 |
| JP | 2001-298292 A | 10/2001 |
| JP | 2003-46279 A | 2/2003 |
| WO | 02/49106 | 6/2002 |

* cited by examiner

*Primary Examiner* — Gregory Thompson
(74) *Attorney, Agent, or Firm* — DLA Piper LLP (US)

(57) ABSTRACT

The invention relates to a cooling arrangement with a first and at least one second heat-creating computer component, each coupled to at least one heatsink (40, 50). Heatsinks (40, 50) are arranged one after the other in a plane (10) in the direction of a provided coolant air stream (30). The cooling arrangement is distinguished in that heatsinks (40, 50) are of identical construction, and each heatsink (40, 50) comprises at least two side-by-side areas (41, 42, 51, 52) with heat transfer properties different from one another. In addition, heatsinks (40, 50) are arranged in plane (10) rotated relative to one another in such a manner that areas (42, 52) of heatsinks (40, 50) with a higher respective heat transfer power than the adjacent area (41, 51) are arranged one after the other in the direction of coolant air stream (30).

8 Claims, 2 Drawing Sheets

METHOD AND DEVICE FOR COOLING HEAT-GENERATING COMPUTER COMPONENTS

RELATED APPLICATION

This application claims priority of German Patent Application No. 102008060777.0 filed Dec. 5, 2008, herein incorporated by reference.

TECHNICAL FIELD

This disclosure relates to a cooling arrangement with a first and at least one second heat-creating computer component, each coupled to at least one heatsink. The heatsinks are arranged one after the other in a single plane, in the direction of a provided coolant air stream.

BACKGROUND

Computers comprise numerous different electrical, electronic and integrated components that require electrical power to function. Parts of this electrical energy are converted into undesired heat. This heat must be removed to avoid damage to the components from overheating. With the increasing development of computers, these electrical, electronic and integrated components, particularly integrated components and their circuits, are becoming smaller in spatial extent with an increasing performance. Accompanying this, the amount of lost energy is increasing in a smaller area. Therefore, the amount of undesired heat that must be removed necessarily also increases. The importance of a more efficient cooling of the heat-generating computer components has, therefore, increased.

Heatsinks for removing the undesired heat are known. Heatsinks are made of solid materials such as aluminum, and conduct undesired heat away from the electrical, electronic and integrated components to the ambient air.

Providing a cooling arrangement for cooling the heat-generating computer components, with a first and at least one second heat-creating computer component, each coupled to at least one heatsink, is known from US 2008/0041562 A1. The heatsinks are arranged one after the other in a single plane, in the direction of a provided coolant air stream. This arrangement implies that only coolant air that has been preheated by the upstream heatsink reaches the heatsink arranged downstream in the direction of the coolant air. Accordingly, the cooling power that can be achieved at the downstream heatsink in such an arrangement is always lower than the cooling power at the upstream heatsink. To compensate for this effect and nonetheless achieve sufficient cooling at the downstream heatsink, it is proposed in US 2008/0041562 A1 that the cooling power at the downstream heatsink be improved by forming a coolant air stream that passes the first heatsink and the second heatsink and, thus, cools the two heatsinks one after the other. It is additionally proposed, according to US 2008/0041562A1, that an additional coolant air stream be formed, which cools only the downstream heatsink. Alternatively to this measure, it is proposed in US 2008/0041562 that the downstream heatsink be formed larger than the upstream heatsink, and, thus, the surface of the downstream heatsink be increased relative to the upstream heatsink, and in that way, the heat transfer properties of the downstream heatsink for emitting heat to the coolant air be improved in comparison to the upstream heatsink. To form the larger surface area, narrower spacings of the cooling fins, or higher cooling fins in comparison to the upstream heatsink are proposed.

This solution is suitable for improving the cooling properties of the downstream heatsink, but leads to increased production costs because a larger number of cooling fins are produced due to the narrower spacing between the cooling fins, and with an increase in the size of the cooling fins themselves of the downstream heatsink, more material and, therefore, higher production costs are necessary.

Therefore, it could be helpful to propose a solution with which a sufficient cooling power can be achieved at both heat sinks, and the same time production costs can be reduced in comparison to known measures.

SUMMARY

I provide a cooling arrangement with a first and at least one second heat-generating computer component, each coupled to at least one heatsink, wherein the heatsinks are arranged one after the other in a plane in the direction of a provided coolant air stream, characterized in that the heatsinks are of identical construction, and each heatsink comprises at least two side-by-side areas with heat transfer properties different from one another, and the heatsinks are arranged rotated or offset relative to one another in the plane in such a manner that one of the areas of the downstream heatsink is downstream in the direction of the coolant air stream essentially only of the area of the upstream heatsink with the worse heat transfer properties.

I provide a method with a first and at least one second heat-generating computer component, each of which is coupled to a heatsink, wherein a coolant air stream is provided that cools first and second heatsinks, and wherein the heatsinks are arranged one after the other in the direction of coolant air stream in a plane in the direction of a provided coolant air stream, characterized in that the two heatsinks are of identical construction, and each comprises side-by-side areas with heat transfer properties different from one another and arranged one after the other in such a manner that, in the flow direction of the coolant air stream, one area of downstream heatsink is downstream in the direction of the coolant air stream only of the area of upstream heatsink with the worse heat transfer property.

LIST OF REFERENCE SYMBOLS

Figure 1:
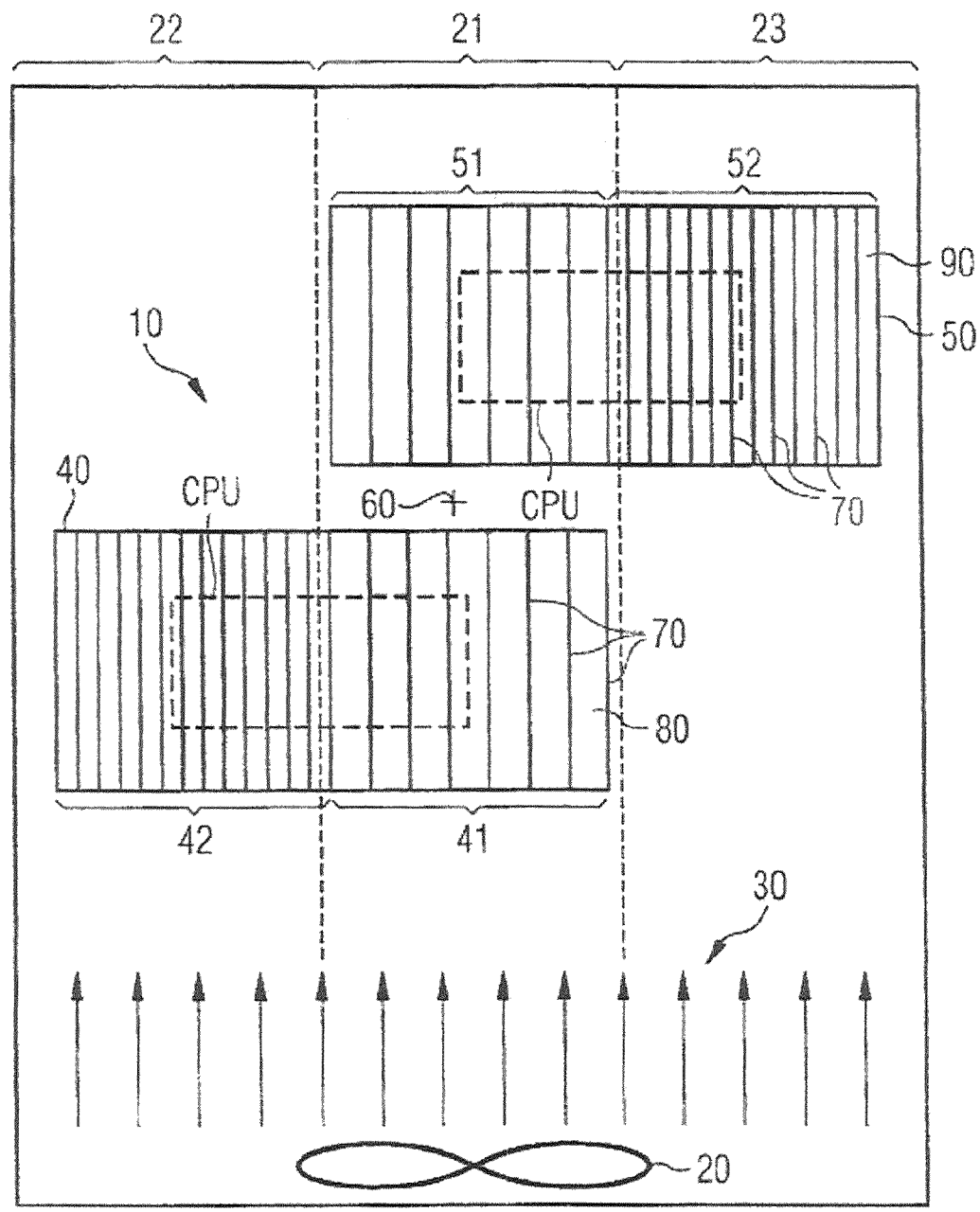
FIG. 1 shows two heatsinks rotated with respect to one another.

10 Plane
20 Fan
21, 22, 21 Coolant air substreams
30 Coolant air stream
40 Upstream heatsink
50 Downstream heatsink
41/42 Side-by-side areas of the upstream heatsink
51/52 Side-by-side areas of the downstream heatsink
60 Point
70 Cooling fins
80 First spacing dimension
90 Second spacing dimension

DETAILED DESCRIPTION

I provide a cooling arrangement and a cooling method for cooling a first and at least one second heat-creating computer component, each coupled to at least one heat sink, is proposed. The heatsinks are arranged one after the other in a single plane, in the direction of a provided coolant air stream. The solution is distinguished from the known prior art in that the heatsinks are of identical construction, and each heat sink comprises at least two areas side-by-side with mutually different heat transfer properties or flow resistances, of which one area is constructed with better heat transfer properties, or higher flow resistances, and one area is constructed with worse heat transfer properties or lower flow resistances. In addition, the heatsinks are rotated in the plane around a point lying in the plane in such a manner that the areas of the heatsinks with the respectively worse heat transfer property, or lower flow resistances are arranged one after the other in the direction of the coolant airflow. Alternatively, the heatsinks are arranged offset with respect to one another in the plane, not rotated, in such a manner that the area of the downstream heatsink with the better heat transfer properties, or the higher flow resistances, is downstream of essentially only the area of the upstream heatsink with the worse heat transfer properties, or the tower flow resistances.

In addition, at least one first coolant air substream is generated, which essentially cools the area of the upstream heatsink with the worse heat transfer properties, or lower flow resistances, and cools one of the areas of the downstream heatsink in the direction of the coolant air flow. Because of the worse heat transfer characteristics, or lower flow resistances, the first coolant air substream absorbs a lesser amount of heat energy than does an adjacent second coolant air substream that cools the area with the better transfer properties or higher flow resistances. As a result, the temperature level of the first coolant air substream upon leaving the upstream heatsink is lower than the temperature level of the second coolant air substream. Therefore, sufficiently cool coolant air is available with the first coolant air substream at the downstream heatsink to be able to still achieve a sufficient cooling effect at the downstream heatsink. This has the additional result that with the second coolant air substream, a coolant air substream is created that essentially cools only the area of the upstream heatsink with the better heat transfer properties, or the lower flow resistances.

It is additionally advantageous with the arrangement that a savings of production costs is created in two ways by the identical construction of the heatsinks. First, the downstream heatsink now no longer requires more material than the upstream heatsink. Second, the production costs can likewise be reduced by the identical construction, since machines for the production of the identical heatsinks can be utilized twice as well.

The effectiveness of an individual heatsink can be fundamentally described by means of two physical parameters. One of these physical parameters is the thermal conductivity of a solid, a liquid or a gas and its ability to transport thermal energy by means of thermal conduction. The specific thermal conductivity is differentiated as a temperature dependent material constant from the absolute thermal conductivity. The absolute thermal conductivity is a characteristic number dependent on the dimension of a component. The specific thermal conductivity is independent of the dimensions of the component, and is a material constant of the material from which the heatsink is constructed in relation to a heatsink, the thermal conductivity accordingly describes the property of the heatsink for conducting the heat front a first transfer surface, for example, the transfer surface that is coupled to the electrical, electronic or integrated component, to a second transfer surface.

An additional physical parameter for describing the effectiveness of a heatsink is the heat transfer from a solid to a gaseous or liquid body in contact with it. The heat transfer is directly proportional to the size of the transfer surface and to the magnitude of the temperature difference between the two bodies. In relation to a heatsink, the heat transfer accordingly describes, first, the property of the heatsink for absorbing heat from the electrical, electronic or integrated component coupled to the heat sink at the first transfer surface and, second, property for outputting the heat at the second transfer surface to the ambient medium, for example air. Since the heat transfer is also directly dependent on the temperature difference between the two bodies, fresh coolant air is constantly brought in by means of the coolant air flow to keep the temperature level of the coolant air as low as possible. Accordingly, the area of the heatsink with worse heat transfer properties transports a lower amount of thermal energy to the air surrounding the heatsink than does the area with better heat transfer properties.

It is advantageous with the proposed arrangement that the improvement of the heat transfer at the downstream heatsink is achieved with heatsinks of identical construction, without the flow speed and, thus, the amount of air that passes by the two heatsinks being increased.

By means of cooling fins, which have this name because of their fin-like design, the surface area of a body can be easily enlarged in comparison to a smooth surface. Thereby, the heat transfer to the air at the second surface is improved. The cooling fins are a construction made of thermally conductive material such as the metal of the heatsink.

An advantageous aspect therefore provides that the heatsink be constructed with cooling fins that are arranged parallel in their longitudinal orientation to the provided coolant air stream. This yields the advantage that, not only is the second surface of the heatsink enlarged by comparison to a flat surface, hut also improved flow properties at the heatsinks result from the cooling fins. This provides a constant supply of coolant air to the heatsinks.

Another advantageous aspect provides that areas of mutually different heat transfer properties are formed by different spacings of the cooling fins. The area of the heatsink with the better heat transfer properties than the adjacent area is, thus, formed by designing the spaces between the heatsinks to be smaller. Thus, a larger number of cooling fins and, therefore, a larger second surface is possible on the footprint of the heatsink. In this way, material is saved in production, since the area with lower heat transfer has a smaller number of cooling fins with respect to the area of higher heat transfer. In addition, a flow resistance caused by the cooling fins can likewise be formed differently at the areas with differently designed spacings. The area with the smaller distances between the cooling fins, therefore, has a higher flow resistance than the area with the larger distances between the cooling fins. This also has an effect on the heat output of the respective area. The area with the higher flow resistance, thus, brings about a better heat output to the coolant air.

According to another advantageous aspect, it is provided that the coolant air stream is produced by means of a fan. In comparison to a coolant air stream generated, for instance, by natural convection, a coolant air stream can be very rapidly varied by the fan. Thus, a quick reaction to changed environmental conditions is possible, because the flow rate from the fanny can be rapidly increased, while the flow rate of an air stream formed by natural convection cannot be quickly influenced. The arrangement constructed according to the aforementioned principle allows an efficient cooling power at the upstream heatsink just as at the downstream heatsink. In contrast to the known prior art, the conveyance power of the fan accordingly need not be increased merely to provide the downstream heatsink with sufficient coolant air. Consequently, the power consumption and the energy input that is necessary to transport away the heat is comparatively small. Another advantage of the aforementioned principle is that, with the better cooling property, the noise generation of the fan, for example, is not increased. This is achieved in that, essentially, the area of lower heat transfer on both heatsinks is cooled by one air stream, and, in addition, an area that is cooled by unheated coolant air is formed on the downstream heatsink.

The apparatus and method have been described above with respect to its principal properties and their respective advantages. They will be described in detail below on the basis of examples with the aid of figures.

Identical parts are furnished with identical reference numbers in the different figures.

FIG. 1 shows a schematic representation of two heatsinks arranged on a plane 10. Plane 10 is representative of, for example, a computer mainboard on which two integrated components (IC) such as computer central processors CPU are arranged in the illustrated embodiment.

Computer central processors CPU are central processing, units of the computer and have a high heat generation. Computer central processors CPU are generally embedded in block-like housings. These block-like housings are thermally coupled to the heatsinks. That is to say, the block-like housings output thermal energy in the form of heat to the heatsinks.

A stream of coolant air 30 that passes over plane 10 is produced by means of a fan 20. An upstream heatsink 40 in the direction of the coolant airflow 30, as well as a downstream heatsink 50 in the direction of coolant air stream 30 are arranged on plane 10. Upstream heatsink 40 is identical in construction to downstream heatsink 50. Each of the two heatsinks 40, 50 has two side-by-side areas 41, 42 and 51, 52, respectively, with heat transfer properties different from one another. Area 41 of upstream heatsink 40 is the area with the worse heat transfer properties. Area 42 of upstream heatsink 40 is the area with the better heat transfer properties. The situation is the same for heatsink 50; area 51 is the area with the worse heat transfer properties, and area 52 is the area with the better heat transfer properties.

Heatsinks 40, 50 are arranged rotated about a point 60 in plane 10 in such a manner that in plane 10, the areas 41, 51 of heatsinks 40, 50 with the worse heat transfer properties are arranged one after the other in the direction of the provided coolant air stream 30.

For purposes of explanation, coolant air stream 30 in the present embodiment is divided into three coolant air substreams 21, 22, 23. First coolant air substream 21 cools the area 41 of upstream heatsink 40 and area 51 of downstream heatsink 50. Area 41 of upstream heatsink 40 is constructed with worse heat transfer properties in comparison to area 42 of upstream heatsink. In the embodiment of FIG. 1, this is achieved by means of a lower density of cooling fins 70. The lower density of cooling fins 70 is formed by providing, for an approximately equal footprint of areas 41, 42, a first spacing dimension 80 between the cooling fins 70 in area 41, the size of which is larger than a second spacing dimension 90 that is provided between the cooling fans of area 42. The same applies to areas 51 and 52 of downstream heatsink 50. Thus, area 42 of upstream heatsink 40, just like area 52 of downstream heatsink 50 has improved heat transfer properties in comparison to areas 41 or 51 of the two heatsinks 40 and 50, in addition, the flow resistances of areas 41, 42, 51, 52 are different. Because of the larger distance between cooling fins 70, areas 41, 51 have a lower flow resistance to the coolant air stream than do areas 42 and 52. By means of the improved heat transfer properties of areas 42 and 52 of the two heatsinks, sufficient cooling effect is achieved on both heatsinks in coolant it substream 21. In addition, coolant air substreams 22 and 23 at areas 41 and 51, respectively, of the two heatsinks are not preheated or shadowed by an upstream heatsink, so that good flow conditions can be achieved in the areas with better heat transfer properties.

Cooling fins 70 extend spatially in their length direction in the flow direction of coolant air stream 30. Thereby, the flow conditions at the heatsinks are further improved, whereby the efficiency of the cooling is additionally improved.

Figure 2:
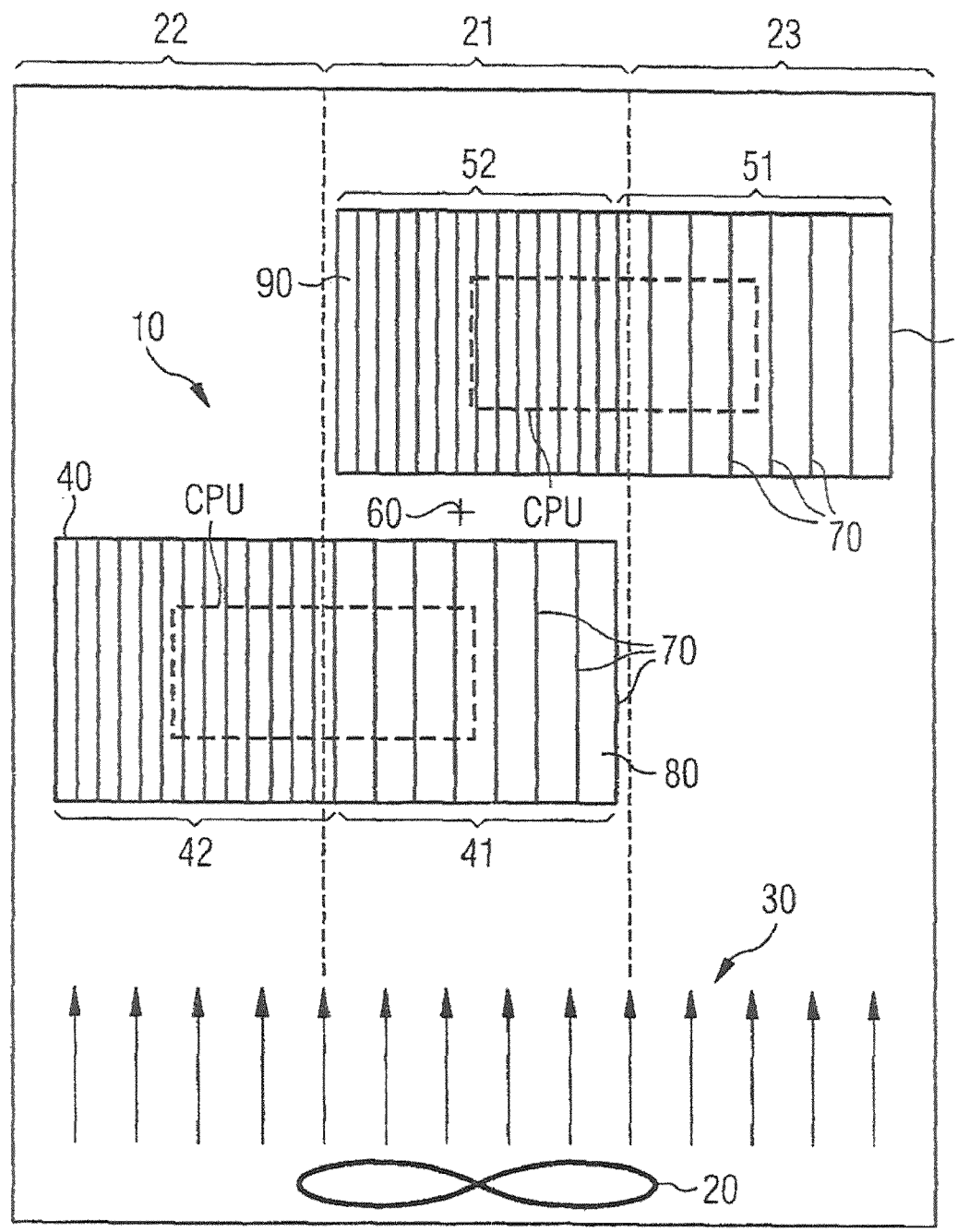
FIG. 2 shows two heatsinks offset with respect to one another.

FIG. 2 shows a schematic representation of two heatsinks arranged on plane 10. In this embodiment as well, a stream of coolant air 30 that passes over plane 10 is produced by means of a fan 20. An upstream heatsink 40 in the direction of the coolant airflow 30, as well as a downstream heatsink 50 in the direction of coolant air stream 30 are arranged on plane 10. Upstream heatsink 40 is identical in construction to downstream heatsink 50. Each of the two heatsinks 40, 50 has two side-by-side areas 41, 42 and 51, 52, respectively, with heat transfer properties different from one another. Area 41 of upstream heatsink 40 is the area with the worse heat transfer properties than area 42 of upstream heatsink 40, which has the better heat transfer properties. The situation is the same for heatsink 50; area 51 is the area with the worse heat transfer properties, and area 52 is the area with the better heat transfer properties.

Heatsinks 40, 50 are arranged in plane 10 offset to one another in the direction of coolant air stream 30. The offset arrangement is selected such that coolant air substream 21 essentially first flows across area 41 of upstream heatsink 40 and then area 52 of downstream heatsink 50.

Thus, first coolant air substream 21 cools area 41 of upstream heatsink 40 and area 52 of downstream heatsink 50. Area 41 of upstream heatsink 40 is constructed with worse heat transfer properties in comparison to area 42 of upstream heatsink 40. In FIG. 2, this is achieved by a lower density of cooling fins 70, which results in a lower flow resistance. One achievement of this measure is that coolant air substream 21 absorbs less heat energy at area 41 of the upstream heatsink and, therefore, can still absorb sufficient heat energy when passing over area 52 of downstream heatsink 50 to achieve a cooling effect at this area, as well. Furthermore, coolant air substream 22 cools area 42 of upstream 40 more intensely because of the better heat transfer properties, or higher flow resistance, of this area. By the improved heat transfer properties, or the higher flow resistance, of areas 42 and 52 of the two heatsinks, a sufficient cooling effect is achieved at these heatsinks in the respective coolant air substreams 21 and 22. Thus, coolant air substream 22 cools only area 42 of upstream heatsink 40, so that the heating of coolant air substream 22 has no disadvantageous effect on downstream heatsinks. In addition, coolant air substream 21 cools area 41 of upstream heatsink 40 lightly, and area 52 of downstream heatsink 50 intensely. Coolant air substream 23 cools area 51 of downstream heatsink 50 without prior heating and, thus, achieves a maximum temperature difference for cooling at this area 51. Therefore, an optimal cooling performance overall results for both heatsinks 40 and 50.

In FIG. 2 as well, cooling fins 70 extend spatially in their length direction in the flow direction of coolant air stream 30.

Thereby, the flow conditions at the heatsinks are further improved, whereby the efficiency of the cooling is additionally improved.

It holds for both structures that an overlap area is formed by the rotated or offset arrangement of the two heatsinks 40 and 50 relative to one another. This is the area in which coolant air stream 30 flows first over upstream heatsink 40 and then over downstream heatsink 50. Due to the larger spacing of cooling fins 70 on area 42 of upstream heatsink 40, more coolant air is available in the overlap area at the downstream heatsink. Optimal flow conditions at the heatsinks are formed if the flow resistance of area 42 or 52 has a flow resistance value half the flow resistance of area 41 or 51, respectively.

The invention claimed is:

1. A cooling arrangement with a first and at least one second heat-generating computer component, each coupled to at least one heatsink, wherein the heatsinks are arranged one after another in a plane in a direction of a provided coolant air stream, wherein the heatsinks are of identical construction, and each heatsink comprises at least two side-by-side areas with heat transfer properties and flow resistances different from one another, and the heatsinks are arranged relative to one another in the plane such that an area with worse heat transfer properties and worse flow resistance of a downstream one of the heatsinks is downstream in the direction of the coolant air stream of an area with the worse heat transfer properties and the worse flow resistance of the upstream heatsink.

2. The cooling arrangement according to claim 1, wherein the heatsinks comprise cooling fins arranged parallel to the coolant air stream in their longitudinal extension.

3. The cooling arrangement according to claim 2, wherein the areas with different heat transfer properties are formed by different spacings of the cooling fins.

4. The cooling arrangement according to claim 3, wherein the coolant air stream is produced by a fan.

5. A method with a first and at least one second heat-generating computer component, each of which is coupled to a heatsink, wherein a coolant air stream is provided that cools first and second heatsinks, and wherein the heatsinks are arranged one after another in a direction of the coolant air stream in a plane in the direction of the coolant air stream, wherein the two heatsinks are of identical construction, and each comprises side-by-side areas with heat transfer properties and flow resistances different from one another, and the heatsinks are arranged relative to one another in the plane such that an area with worse heat transfer properties and worse flow resistance of a downstream one of the heatsinks is downstream in the direction of the coolant air stream only of an area with the worse heat transfer properties and the worse flow resistance of the upstream heatsink.

6. The method according to claim 5, wherein the heatsinks comprise cooling fins arranged in their longitudinal extension parallel to the coolant air stream.

7. The method according to claim 6, wherein the areas with different heat transfer properties are formed by different spacings of the cooling fins.

8. The method according to one of claims 4-6, wherein the coolant air stream is produced by a fan.

* * * * *